US008153502B2

(12) United States Patent
Li et al.

(10) Patent No.: US 8,153,502 B2
(45) Date of Patent: Apr. 10, 2012

(54) METHODS FOR FILLING TRENCHES IN A SEMICONDUCTOR MATERIAL

(75) Inventors: Li Li, Boise, ID (US); Ronald Weimer, Boise, ID (US); Richard Stocks, Boise, ID (US); Chris Hill, Boise, ID (US)

(73) Assignee: Micron Technology, Inc., Boise, ID (US)

(*) Notice: Subject to any disclaimer, the term of this patent is extended or adjusted under 35 U.S.C. 154(b) by 284 days.

(21) Appl. No.: 11/434,982

(22) Filed: May 16, 2006

(65) Prior Publication Data

US 2007/0269958 A1 Nov. 22, 2007

(51) Int. Cl.
*H01L 21/76* (2006.01)
*H01L 21/302* (2006.01)
*H01L 21/31* (2006.01)

(52) U.S. Cl. ........ 438/437; 438/723; 438/772; 438/773; 257/E21.546

(58) Field of Classification Search .................. 438/437, 438/723, 772, 773; 257/E21.546
See application file for complete search history.

(56) References Cited

U.S. PATENT DOCUMENTS

| | | | | |
|---|---|---|---|---|
| 4,872,947 A * | 10/1989 | Wang et al. | ...................... | 216/38 |
| 5,271,972 A * | 12/1993 | Kwok et al. | ................... | 427/579 |
| 5,700,712 A * | 12/1997 | Schwalke | ...................... | 438/430 |
| 5,702,972 A * | 12/1997 | Tsai et al. | ...................... | 438/305 |
| 5,817,567 A * | 10/1998 | Jang et al. | ...................... | 438/427 |
| 5,828,102 A * | 10/1998 | Bergemont | ................... | 257/342 |
| 5,882,535 A | 3/1999 | Stocks et al. | | |
| 5,963,818 A * | 10/1999 | Kao et al. | ...................... | 438/424 |
| 6,291,341 B1 | 9/2001 | Sharan et al. | | |
| 6,291,359 B1 | 9/2001 | Donohoe et al. | | |
| 6,426,291 B1 | 7/2002 | Hu et al. | | |
| 6,433,378 B1 | 8/2002 | Hill | | |
| 6,497,827 B1 | 12/2002 | Li et al. | | |
| 6,596,641 B2 | 7/2003 | Jost et al. | | |
| 6,599,840 B2 | 7/2003 | Wu et al. | | |
| 6,680,255 B2 | 1/2004 | Donohoe et al. | | |
| 6,734,531 B2 | 5/2004 | Weimer et al. | | |
| 6,777,308 B2 | 8/2004 | Li et al. | | |
| 6,784,111 B2 | 8/2004 | Donohoe et al. | | |
| 6,787,877 B2 | 9/2004 | Hill | | |
| 6,794,266 B2 * | 9/2004 | Shih et al. | ...................... | 438/422 |
| 6,802,944 B2 | 10/2004 | Ahmad et al. | | |
| 6,828,252 B2 | 12/2004 | Jost et al. | | |
| 6,914,015 B2 | 7/2005 | Belyansky et al. | | |
| 6,924,197 B2 | 8/2005 | Weimer | | |

(Continued)

OTHER PUBLICATIONS

A. Shareef et al., Subatmospheric Chemical Vapor Deposition Ozone/TEOS Process for SiO$_2$ Trench Filling, J. Vac. Sci. Technol. B 13(4), Jul./Aug. 1995.

(Continued)

*Primary Examiner* — Walter L Lindsay, Jr.
*Assistant Examiner* — Ron Pompey
(74) *Attorney, Agent, or Firm* — Fletcher Yoder

(57) ABSTRACT

Methods of filling cavities or trenches. More specifically, methods of filling a cavity or trench in a semiconductor layer are provided. The methods include depositing a first dielectric layer into the trench by employing a conformal deposition process. Next, the first dielectric layer is etched to create a recess in the trench within the first dielectric layer. The recesses are then filled with a second dielectric layer by employing a high density plasma deposition process. The techniques may be particularly useful in filling cavities and trenches having narrow widths and/or high aspect ratios.

30 Claims, 3 Drawing Sheets

U.S. PATENT DOCUMENTS

| | | |
|---|---|---|
| 6,940,171 B2 | 9/2005 | Hill |
| 6,982,207 B2 | 1/2006 | Bai et al. |
| 6,982,228 B2 | 1/2006 | Jost et al. |
| 7,019,351 B2 | 3/2006 | Eppich et al. |
| 7,030,034 B2 | 4/2006 | Fucsko et al. |
| 7,037,859 B2 * | 5/2006 | Ingle et al. ............ 438/763 |
| 7,199,022 B2 * | 4/2007 | Yasui et al. ............ 438/437 |
| 2004/0262263 A1 | 12/2004 | Donohoe et al. |

OTHER PUBLICATIONS

D.R. Cote et al., Plasma-Assisted Chemical Vapor Deposition of Dielectric Thin Films for ULSI Semiconductor Circuits, www.research.ibm.com/journal/rd/431/cote.html, Mar. 26, 1998.

S.V. Nguyen, High-Density Plasma Chemical Vapor Deposition of Silicon-Based Dielectric Films for Integrated Circuits, www.research.ibm.com/journal/rd/431/nguyen.html, Jan. 12, 1998.

* cited by examiner

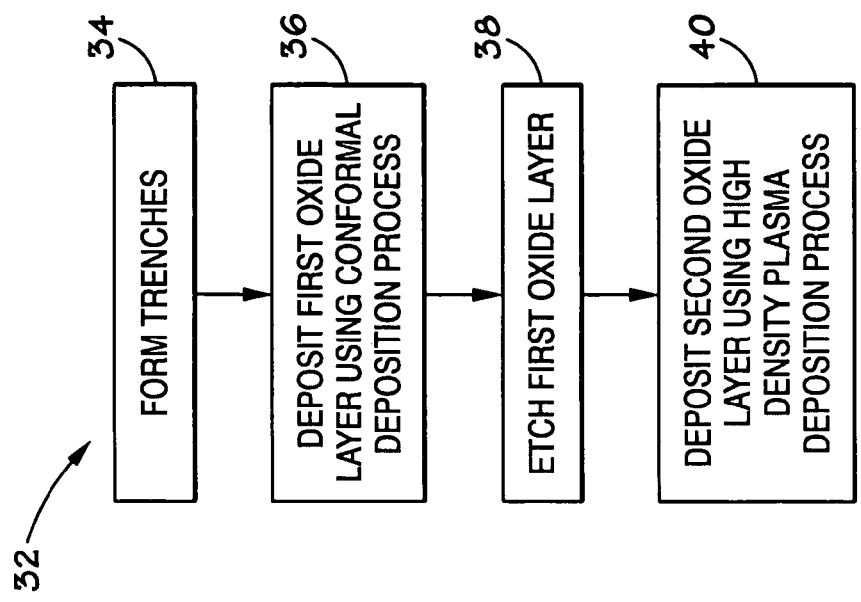
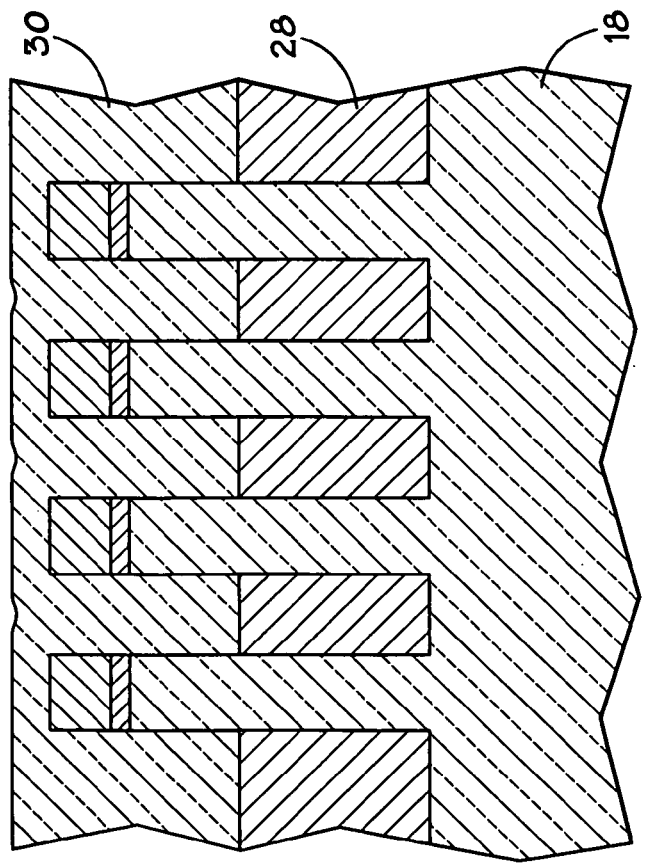

METHODS FOR FILLING TRENCHES IN A SEMICONDUCTOR MATERIAL

BACKGROUND OF THE INVENTION

1. Field of the Invention

The present invention relates generally to high density integrated circuit devices. More specifically, embodiments of the present invention relate to methods for depositing dielectric material into trenches in a semiconductor material.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

The fabrication of integrated circuit devices, such as those employed in memory chips and microprocessors, presents a number of challenges. This is especially true in high density applications where technological demands drive ever-decreasing feature sizes in the integrated circuit devices. Because many of the structures in integrated circuit devices must be physically or electrically isolated from one another, much of the volume in the densely populated integrated circuit devices are dedicated to isolation areas or isolation regions. One useful technique for isolating microstructures in the integrated circuit devices is shallow trench isolation (STI). STI generally involves forming trenches in one or more active semiconductor materials to physically and electrically isolate active regions on opposite sides of the trench. The trenches are then filled with a dielectric material, such as a Si-oxide, to complete the trench isolation of the active structures.

While STI does offer certain advantages over competing isolation techniques, such as the formation of smaller geometries, STI does introduce certain fabrication challenges. These challenges are exacerbated as the trench geometries have decreased. Specifically, for trenches having very narrow widths and/or a high trench height to trench width ratio (i.e, "aspect ratio"), complete and void-free trench fill with the dielectric material becomes increasingly difficult. Generally, as the trench widths decrease and the aspect ratios increase, deposition and growth techniques for depositing the dielectric layer in the trench are increasingly susceptible to a "pinch-off" condition wherein the dielectric material deposits over the top corners of the trenches in such a way that the trench opening is pinched off at the top before the underlying trench is completely filled with the dielectric material. Failure to fill the gap completely results in the formation of voids in the deposited dielectric layer which may adversely affect device operation by trapping undesirable impurities in the trench.

Accordingly, there is a need for improved methods of depositing void free dielectric material in trenches having narrow widths and/or having high aspect ratios.

BRIEF DESCRIPTION OF THE DRAWINGS

Advantages of the invention may become apparent upon reading the following detailed description and upon reference to the drawings in which:

FIGS. 2-5 are cross-sectional views illustrating trench fill techniques in accordance with embodiments of the present invention; and FIG. 6 is a flow chart illustrating the process steps for filling trenches in accordance with embodiments of the present invention.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
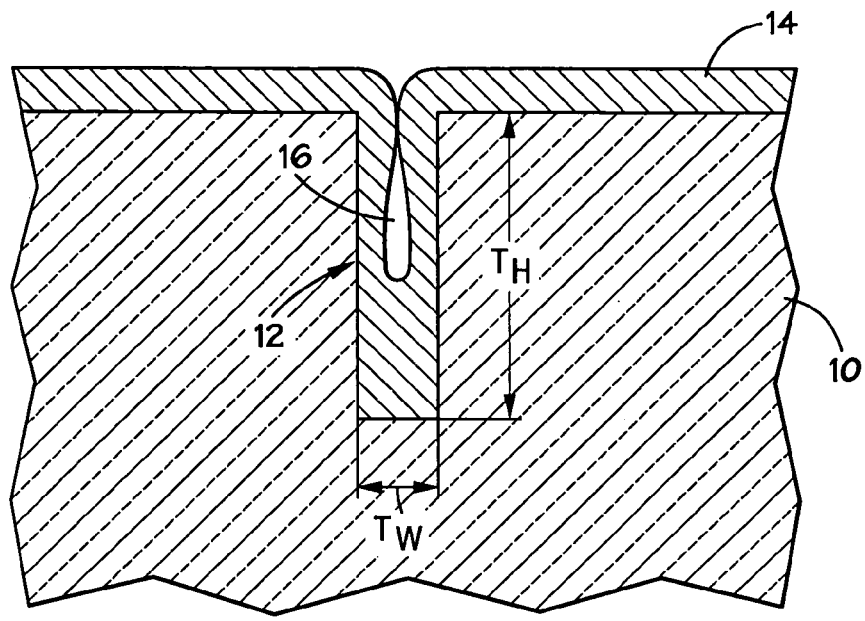
FIG. 1 is a cross-sectional view illustrating the formation of a void in a trench employing conventional trench fill techniques.

Referring now to FIG. 1, a cross-sectional view of a trench formed in a semiconductor layer is provided to illustrate the conditions described above and relating to the voiding that may occur during trench fill techniques employing conventional processes. Specifically, a semiconductor layer 10 having a trench 12 formed therein, is illustrated. The cavity or trench 12 may be formed in the semiconductor layer 10 by any suitable process. For example, the trench 12 may be formed by an STI method, such as a wet or dry etch process, for instance. The trench 12 has a trench height ($T_H$) and a trench width ($T_W$). As will be appreciated, voiding is more likely to occur in trenches having a narrow trench width and/or a high aspect ratio.

To illustrate the deficiencies of employing conventional techniques to fill the trench 12, the dielectric layer 14 having been disposed by conventional means is illustrated. As illustrated in FIG. 1, the deposition of the dielectric layer 14 by conventional means such as chemical vapor deposition (CVD) results in a layer of dielectric material which collects at the corners of the upper portion of the trenches. Thus, the dielectric material 14 will typically grow together faster at the top of the trench 12 thereby pinching off the opening at the top of the trench 12 before the trench 12 is filled. This will result in the formation of a void 16 in the dielectric material 14 filling the trench 12.

One deposition technique which is often employed to improve trench fill, is a high density plasma (HDP) CVD process. The HDP-CVD process employs deposition and simultaneous etch back of the dielectric material being deposited. Precursor gases such as silane and oxygen are pumped into a chamber along with an inert gas, typically argon. A plasma is formed in a reaction zone proximate to the surface of the substrate by the application of radio frequency (RF) energy. The deposition gases disassociate and react to form a silicon dioxide layer. The relatively non-reactant inert gas is ionized and used to etch the silicon dioxide layer during deposition to keep the gaps from pinching off. The flow rates, RF power and other parameters are controlled to produce the desired rate of deposition and etch. In this manner, trenches in a semiconductor material may be filled. However, HPD-CVD techniques do not always produce a void free trench fill. This is especially true for trenches having a narrow trench width (e.g., $T_W$<0.5 nanometers) and/or a high aspect ratio (e.g., $T_H:T_W$>5:1).

Other more conformal processes such as sub-atmospheric chemical vapor deposition (SACVD), low pressure chemical vapor deposition (LPCVD), plasma enhanced chemical vapor depositon (PECVD), thermal tetraethylorthosilicate (T-TEOS) deposition or ozone TEOS (03-TEOS) deposition may result in a more conformal filling of the trench with fewer voids, in certain instances. However, narrow trench widths and high trench aspect ratios may still lead to void formation or underfill in more conformal processes, as well. Of more concern when employing conformal processes, however, is the seam that is created down the middle of the dielectric material after the trench has been filled. Wet etch techniques have been found to etch the fill region within the trench laterally from the exposed seam. Thus, while the conformal process may result in fewer voids because of the reduced occurrence of pinch off at the top of the trenches, the seam that is created down the middle of the dielectric material when employing a conformal process is highly susceptible to undesirable lateral etching during down stream wet etching of overlying layers.

To improve the trench fill, embodiments of the present invention employ a 3-step trench fill process, as will be described further below with reference to FIGS. 2-6. In general, a conformal deposition process is generally used to fill the trench. Next, an etch-back of the conformally disposed dielectric layer is performed in the trenches. Finally, a high density plasma (HDP) process is used to fill the etch-back regions of the trenches.

Advantageously, the initial conformal deposition process reduces the voiding that occurs in many trench-filling processes. Further, because the upper portion of the trench fill dielectric disposed by the conformal process is subsequently etched back and filled using an HDP process, there is no seam exposure at the upper portions of the trenches, thus reducing the susceptibility of the fill material to lateral etching through a seam in the trench fill material. Because the etch-back produces a shorter trench having a notably smaller aspect ratio than the original structure, the HDP process employed to complete the trench fill is less susceptible to void formation. Accordingly, the process described herein in accordance with embodiments of the present invention results in an improved trench filling process, as described in more detail below.

Figure 2:
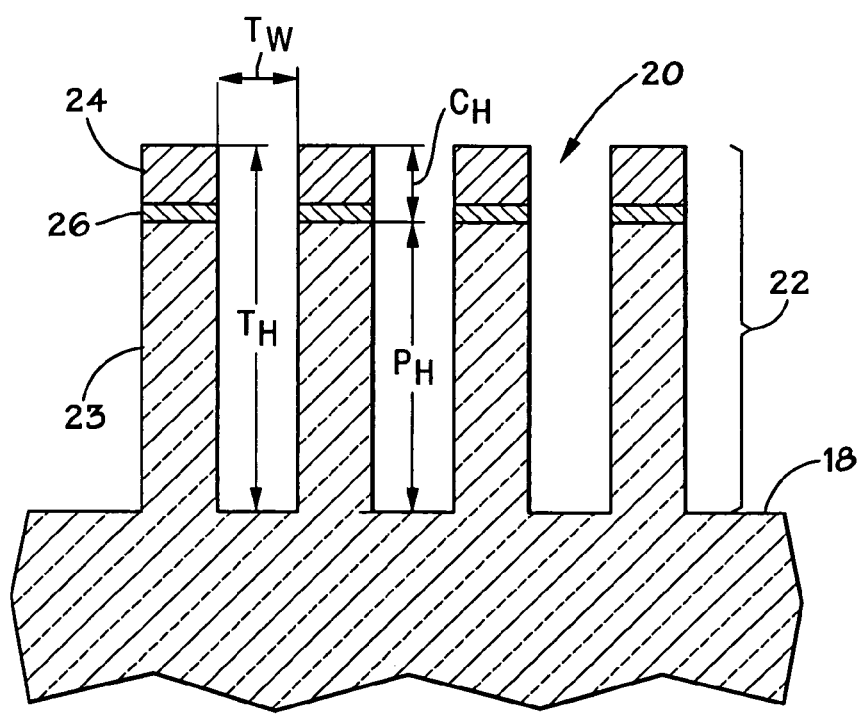

Referring now to FIG. 2, an exemplary semiconductor layer 18 having a number of trenches 20 etched therein to define a number of vertical structures 22. As used herein, the semiconductor layer 18 may comprise any semiconductor material or layer employed in the fabrication of integrated circuit devices. The semiconductor layer 18 may also comprise a semiconductor substrate, which may include, but is not limited to, a bulk semiconductive material such as semiconductor wafer, either alone or in assemblies comprising other materials thereon. More specifically, the semiconductor layer 18 may include semiconductive materials such as single crystalline or poly crystalline silicon, gallium arsenide, indium phosphide, or other materials with semiconductor properties.

In one exemplary embodiment, the semiconductor layer 18 comprises a silicon substrate and the vertical structures 22 are structures formed in the silicon substrate and separated by the trenches 20. As will be appreciated, the vertical structures 22 may ultimately be configured to form active lines of a memory array, transistor gates, or any other structure or active area. Those skilled in the art will appreciate that embodiments of the present techniques of filling the trench 20 will be applicable to filling the isolation areas between any active structures, and especially wherein the isolation region is particularly narrow and/or wherein the aspect ratio is particularly high, as described further below.

In the exemplary embodiment illustrated in FIG. 2, the vertical structures 22 comprise silicon pillars 23 which include nitride caps 24. The vertical structures 22 further include a silicon oxide interface 26 between the silicon pillar 23 and the nitride cap 24. As will be appreciated, the vertical structures 22 may include a number of other materials and layers, in addition to or instead of the illustrated layers, such as protective thermal oxide layers, polysilicon layers, additional dielectric layers or metal layers which may also benefit from employing trench isolation techniques.

As will be appreciated, various techniques may be employed to form the trenches 20 illustrated in FIG. 2. For example, the semiconductor layer 18, along with any overlying layers, (such as the nitride cap 24 and silicon oxide interface 26), may be patterned with a masking layer, such as a hard mask or photoresist (not shown), and the trenches 20 may be anisotropically or isotropically wet or dry etched. The masking layer may be removed from the substrate after formation of the trenches 20.

Relevant to the present discussion, are the trench height ($T_H$), trench width ($T_W$), pillar height ($P_H$), and the cap height ($C_H$). As described here, the pillar height refers to the depth of the trench 20 through the semiconductor layer 18 and the cap height refers to the height of any dielectric materials formed on top of the active semiconductor pillars 23. As described above, the presently described trench filling techniques are particularly useful in filling trenches having a narrow trench width, wherein $T_W$ is less than equal to 500 angstroms. The overall trench height ($T_H$) to be filled is generally greater than 2500 angstroms. Accordingly, the aspect ratio ($T_H:T_W$) is generally greater than 5:1. As illustrated in FIG. 2, the overall trench height ($T_H$) is equal to the pillar height ($P_H$) plus the cap height ($C_H$). That is, $T_H=P_H+C_H$. Generally, the pillar height ($P_H$) is greater than or equal to 2000 angstroms, and the cap height ($C_H$) is approximately 500 angstroms.

Figure 3:
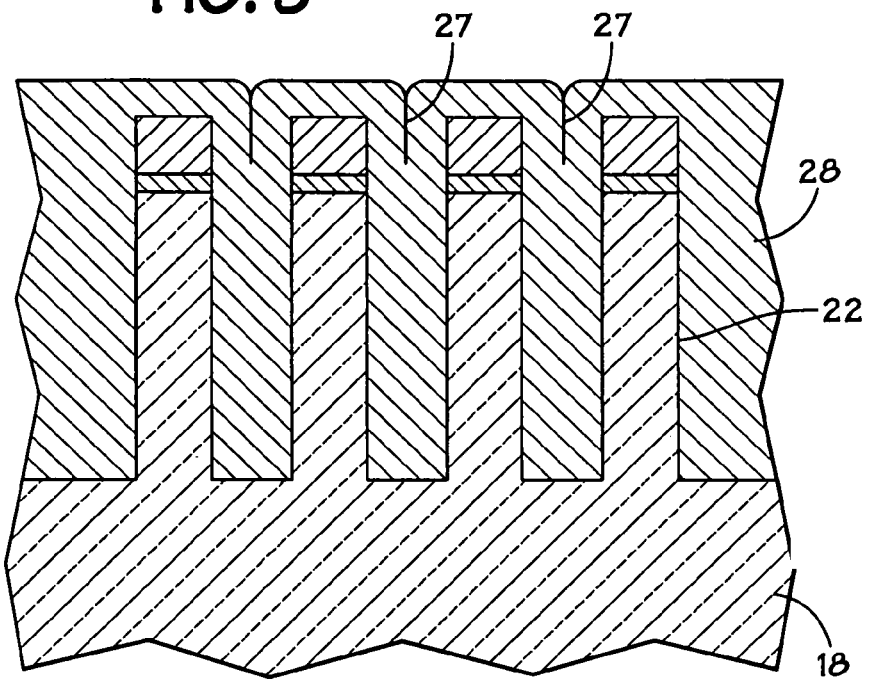

Referring now to FIG. 3, after formation of the trenches 20 and the isolated vertical structures 22, the trenches are filled with a dielectric material. In accordance with embodiments of the present invention, the first step in the fill process is to dispose a dielectric layer 28 such that it completely fills the trenches 20 and covers the vertical structures 22 entirely. In accordance with embodiments of the present technique, the dielectric layer 28 is disposed by a conformal process, such as but not limited to, ozone tetraethylorthosilicate (03-TEOS), thermal tetraethylorthosilicate (T-TEOS), atomic layer deposition (ALD), a pulsed deposition layer (PDL) process, sub-atmospheric chemical vapor deposition (SACVD) or plasma enhanced chemical vapor deposition (PECVD), may be employed. Those skilled in the art will appreciate that various techniques may be employed to conformally dispose the dielectric material 28. Further, it should be understood, that as used herein, disposing the dielectric layer 28 to "completely fill" the trench 20 does not connote "void-free" or "seam-free" filling. Rather, the trench 20 is said to be completely filled with the dielectric layer 28 once the top portion of the trench 20 has been closed or sealed from receiving any further material therein.

As will be appreciated, as used herein, conformality generally refers to a ratio of top film thickness to sidewall film thickness during the deposition process. A process that is a perfectly conformal process will have a 1:1 ratio of top film thickness to sidewall film thickness. That is, the film will be deposited on the top of the structure (adjacent the trench) at the same rate that the film is deposited on the sidewalls of the trench. While deposition techniques may not be perfectly conformal, as used herein, a conformal process refers to a process for depositing a film wherein the conformality is greater than or equal to approximately 5:4 (i.e., the film will deposit along the sidewalls at a rate of at least about 80% of the rate at which it deposits along the top).

As described above, conformal deposition techniques are less susceptible to voiding than other techniques which tend to promote an accelerated rate of growth at an upper portion of the vertical structures 22 such that the opening in the trench 20 will be pinched off before the trench 20 is completely filled with the dielectric material 28. As described further below, any seam 27 resulting from the conformal deposition of the dielectric layer 28 will not cause lateral etching issues associated with wet etch exposure to the seam 27 during down stream processing, because the subsequent steps in the presently described process will prevent such undesirable effects.

One specific exemplary embodiment of conformally depositing the dielectric layer 28 is by employing a low pressure 03-TEOS CVD process. The 03-TEOS CVD process may be plasma enhanced or sub-atmospheric, as well. In one exemplary embodiment of the present invention, an 03-TEOS CVD process having the process parameters associated with TABLE 1 may be implemented to conformally deposit the dielectric layer 28.

TABLE 1

| PARAMETER | RANGE | EXAMPLE |
| --- | --- | --- |
| Temperature (° C.) | 350-600 | 540 |
| Pressure (torr) | 200-600 | 600 |
| TEOS flow (mg/min) | 1000-4000 | 1200 |
| O3 flow (SLM) | 5-20 | 17 |
| Percent O3 (%) | 10-15 | 12.5 |

Figure 4:
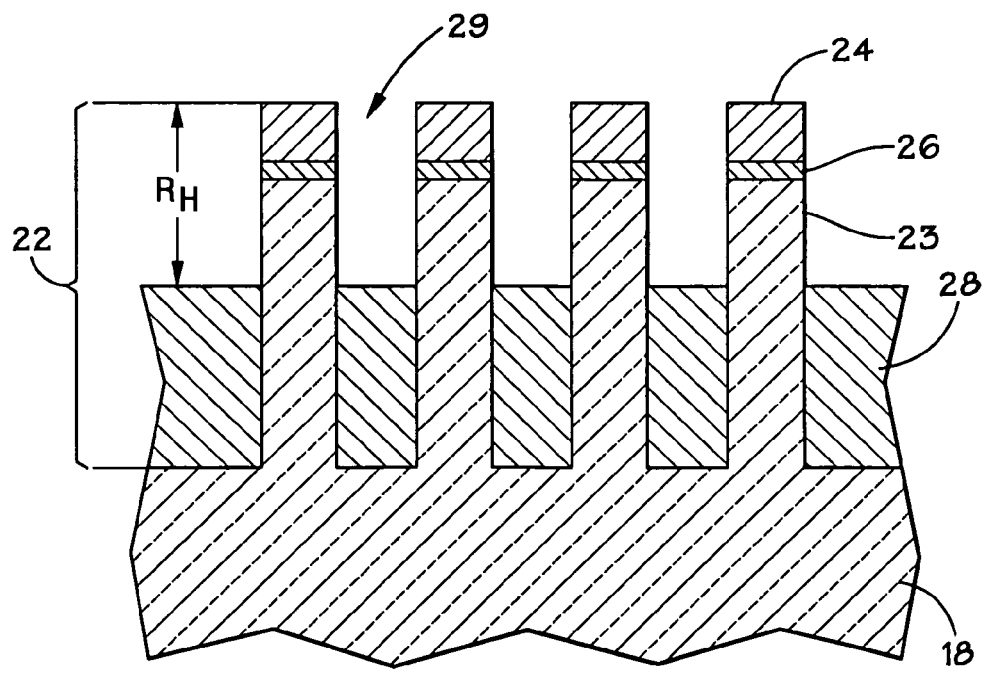

In accordance with embodiments of the present invention, after the conformal deposition of the dielectric material 28, the dielectric material 28 is etched back through the trenches, as illustrated in FIG. 4. The etch back region creates a recess height ($R_H$). In the present exemplary embodiments, the recess height may be equal to approximately half of the trench height ($T_H$). That is, $R_H = \frac{1}{2} T_H$. In the present exemplary embodiments, the recess height may be greater than or equal to 1000 angstroms.

Advantageously, a dry etch process, such as a plasma etch, may be employed in accordance with embodiments of the present invention. As will be appreciated, a dry etch process is more easily controlled and repeatable compared to a wet etch process. Thus, by using a dry etch, the recess height ($R_H$) can be very precisely etched to a desirable depth. Further, dry etch processes are repeatable and etch rates are similar for the various dielectric materials that may be employed in the conformal deposition step, such as various oxides. Further, because the deposition process described with reference to FIG. 3 for depositing the dielectric layer 28 is a conformal process and may produce a seam, the dry etch process is advantageous since the seam of the conformally deposited dielectric layer 28 is not readily susceptible to lateral etching when a dry etch process is employed. The etch-back of the conformally deposited dielectric layer 28 through the original trench 20 creates a recess 29 in the dielectric layer 28. The recess height ($R_H$) may be advantageously controlled such that any voids or seams (e.g., seam 27 illustrated in FIG. 3) in the trench area of the conformally deposited dielectric material 28 may be removed through the dry etch process. It should be understood that while a dry etch process may be advantageous for many applications, a wet etch process may be employed if it can be controlled to a desired degree. Potentially, any etch process that does not selectively or preferentially etch the seam relative to the bulk may be employed.

The portion of the dielectric material 28 remaining in the trenches 20 is at the bottom portion of the trenches 20. As will be appreciated, the lower portion of a fill material disposed in a trench is less susceptible to the voiding and seaming described above. By etching the top portion of the dielectric material 28, the portion of the dielectric material that is more susceptible to voiding and seaming is advantageously removed, thereby mitigating problems associated with such conditions. In one exemplary embodiment, the etchant used for the dry etch process is selective to nitride such that the dielectric material 28, generally an oxide, is etched significantly faster than the nitride cap 24, thereby protecting the underlying silicon pillar 23 of the vertical structure 22.

Referring now to FIG. 5, the third step of the exemplary process is illustrated, wherein the recesses 29 described in FIG. 4, are re-filled, this time employing a high density plasma (HDP) process. Alternatively, a spin on dielectric (SOD) process may be employed. In one exemplary embodiment, an HDP CVD process may be used to deposit the dielectric material 30. As will be appreciated, to achieve adequate gap fill, the HPD CVD system is generally run at a high flow rate to achieve adequate deposition while maintaining a relatively low pressure within the chamber such that the plasma can operate at high density. Because the aspect ratio of the recess 29 ($R_H:T_W$) is less than that of the original aspect ratio of the trench 20 ($T_H:T_W$), the HDP CVD process is less likely to result in voiding during deposition of the second dielectric layer 30. In the presently illustrated embodiment, the aspect ratio of the recess 29 ($R_H:T_W$) is approximately half that of the original aspect ratio of the trench 20 ($T_H:T_W$). As will be appreciated, the dielectric layer 30 may comprise silicon dioxide or silica glass, for example. As described above, HDP oxides are less susceptible to voiding and seaming. Further, any seam remaining in the dielectric material 28 is advantageously covered by the HDP oxide 30, such that the seam will not be exposed to down stream wet etching. TABLE 2 provides exemplary parameter ranges and an exemplary parameter value which may be employed to achieve deposition of the HDP oxide layer.

TABLE 2

| PARAMETER | RANGE | EXAMPLE |
| --- | --- | --- |
| Source RF power (Watts) | 3000-5500 | 4600 |
| Bias RF power (Watts) | 500-4000 | 3000 |
| SiH$_4$ gas flow (sccm) | 20-160 | 70 |
| O$_2$ gas flow (sccm) | 50-150 | 98 |
| He gas flow (sccm) | 150-400 | 285 |
| H$_2$ gas flow (sccm) | 50-300 | 150 |
| Deposition rate (nm/min) | 275-325 | 300 |
| Wet etch rate (Å/min) | | 6.2 in 100:1 HF |
| Refractive index | | 1.46 |

Referring now to FIG. 6, a process flow according to embodiments of the present invention and as illustrated and described above with reference to FIGS. 2-5 is summarized and generally designated by the reference numeral 32. First, trenches are formed in a semiconductor layer, as indicated in block 34. As described above, the semiconductor layer may comprise a substrate, such as a silicon substrate, for example. Further, the vertical structures defined by the trenches may comprise various other materials including but not limited to a nitride cap at the top of each silicon pillar. Next, a first dielectric layer, such as an oxide, is deposited in the trenches using a conformal deposition process, such as 03-TEOS oxide deposition, as indicated in block 36. Next, the first dielectric layer is etched, as indicated in block 38. The etchback of the first dielectric layer is achieved through a dry etch process, such as a plasma etch, and creates a recesses in the first dielectric layer. Finally, a second dielectric layer, such as an oxide layer, is deposited in the recessed regions using an HDP deposition process, as indicated in block 40. The HDP deposition process may comprise an HDP CVD process, for example.

As will be appreciated, the exemplary structures described herein may be useful in fabricating integrated circuit devices, such as memory devices and processors. The exemplary techniques for filling isolation areas between active structures in accordance with embodiments of the present invention may result in more complete trench-fill, with reduced voiding in the trench-fill regions. Embodiments of the present invention may be particularly useful in filling trenches having a narrow trench width (e.g., $T_W$<0.5 nanometers) and/or a high aspect ratio (e.g., $T_H:T_W$>5:1).

While the presently disclosed embodiments are described with regard to trench-fill, "trenches" formed to create vertical structures in a semiconductor material are only shown for illustrative purposes. Those skilled in the art will appreciate that embodiments of the present invention may be useful in filling various types of cavities, which may not be limited to trenches. Further, while "vertical structures" as defined by the associated trenches are illustrated in FIGS. 2-5 as defining pillars, it should be understood that in certain embodiments, a trench or cavity may be formed to define vertical structures that do not resemble pillars, but rather, are discreet trenches or apertures in a layer of material. Still further, while the present techniques are described with regard to forming trenches or cavities in a semiconductor layer, embodiments of the present invention may also be useful in filling trenches or cavities in other materials, such as dielectric materials or conductive materials.

While embodiments of the invention may be susceptible to various modifications and alternative forms, specific embodiments have been shown by way of example in the drawings and have been described in detail herein. However, it should be understood that the invention is not intended to be limited to the particular forms disclosed. Rather, embodiments of the invention are to cover all modifications, equivalents, and alternatives falling within the spirit and scope of these embodiments, as defined by the following appended claims.

What is claimed is:

1. A method of filling a trench in a semiconductor material comprising: conformally depositing a first dielectric layer in the trench to reduce the occurrence of voids and seams, and such that the first dielectric layer completely fills the trench;
etching a portion of the first dielectric layer within the trench to create a recess in the first dielectric layer;
depositing a second dielectric layer in the recess, such that the second dielectric layer completely fills the recess; and
wherein a conformality for conformally depositing the first dielectric layer is greater than or equal to approximately 5:4.

2. The method, as set forth in claim 1, wherein conformally depositing the first dielectric layer comprises depositing by ozone tetraethylorthosilicate (O3-TEOS) deposition.

3. The method, as set forth in claim 1, wherein conformally depositing the first dielectric layer comprises depositing thermal tetraethylorthosilicate (T-TEOS) deposition.

4. The method, as set forth in claim 1, wherein etching a portion of the dielectric layer comprises dry etching the dielectric layer.

5. The method, as set forth in claim 1, wherein etching a portion of the dielectric layer comprises plasma etching of the dielectric layer.

6. The method, as set forth in claim 1, wherein etching a portion of the dielectric layer comprises employing an etchant selective to nitride.

7. The method, as set forth in claim 1, wherein depositing the second dielectric layer comprises depositing by high density plasma (HDP) deposition.

8. The method, as set forth in claim 1, wherein depositing the second dielectric layer comprises depositing by high density plasma chemical vapor deposition (HDP-CVD).

9. The method, as set forth in claim 1, wherein the trench comprises a width of less than or equal to 500 angstroms.

10. The method, as set forth in claim 1, wherein the trench comprises an aspect ratio of greater than or equal to 5:1.

11. The method, as set forth in claim 1, wherein the trench comprises an aspect ratio of greater than or equal to 8:1.

12. The method, as set forth in claim 1, wherein the trench comprises an aspect ratio of greater than or equal to 10:1.

13. The method, as set forth in claim 1, wherein the recess comprises a depth that is less than or equal to half a depth of the trench.

14. A method of filling a trench comprising: etching a trench in a layer;
conformally depositing a first dielectric layer into the trench by ozone tetraethylorthosilicate (O3-TEOS) deposition;
dry etching a portion of the first dielectric layer within the trench to create a recess in the first dielectric layer and to a degree where voids and seams are reduced; depositing a second dielectric layer in the recess by high density plasma (HDP) deposition, such that the second dielectric layer completely fills the recess; and
wherein a conformality for conformally depositing the first dielectric layer is greater than or equal to approximately 5:4.

15. The method, as set forth in claim 14, wherein etching the trench comprises etching a trench in a semiconductor layer.

16. The method, as set forth in claim 14, wherein etching the trench comprises etching a trench in a silicon substrate.

17. The method, as set forth in claim 14, wherein etching the trench comprises etching a trench having an aspect ratio of greater than or equal to 5:1.

18. The method, as set forth in claim 14, wherein etching the trench comprises etching a trench having a width of less than or equal to 500 angstroms and a depth of greater than or equal to 2000 angstroms.

19. The method, as set forth in claim 14, wherein etching the trench comprises etching a trench to define a vertical structure on each side of the trench.

20. The method, as set forth in claim 19, wherein etching the trench comprises etching a trench to define a silicon pillar on each side of the trench.

21. The method, as set forth in claim 20, wherein each of the silicon pillars on each side of the trench comprises a nitride cap thereon.

22. The method, as set forth in claim 21, wherein dry etching the portion of the first dielectric layer comprises etching a recess to a depth greater than a height of the nitride cap.

23. A method of filling a cavity comprising: forming two vertical structures in a material, wherein the vertical structures are defined by a cavity located between the two vertical structures;

completely filling the cavity with a first oxide layer by conformally depositing the first oxide layer in the cavity between the two vertical structures such that the cavity is sealed from receiving further material;

removing a portion of the first oxide layer to create a recess in the first oxide layer between the two vertical structures;

completely filling the recess with a second oxide layer by depositing the second oxide layer by high density plasma (HDP) deposition; and wherein a conformality for conformally depositing the first dielectric layer is greater than or equal to approximately 5:4.

24. The method, as set forth in claim 23, wherein forming two vertical structures in a material comprise forming vertical structures in a semiconductor material.

25. The method, as set forth in claim 23, wherein forming two vertical structures comprises etching the material to form the cavity, wherein the cavity comprises a trench.

26. The method, as set forth in claim 23, wherein completely filling the cavity with a first oxide layer comprises conformally depositing the first dielectric layer into the cavity by ozone tetraethylorthosilicate (O3-TEOS) deposition.

27. The method, as set forth in claim 23, wherein removing a portion of the first oxide layer to create a recess in the first oxide layer between the two vertical structures comprises dry etching the first oxide layer.

28. The method, as set forth in claim 23, wherein the cavity comprises a width of less than or equal to 500 angstroms.

29. The method, as set forth in claim 23, wherein the cavity comprises a height and a width, wherein the ratio of the height to the width is greater than or equal to 5:1.

30. The method, as set forth in claim 23, wherein the cavity comprises a height and a width, wherein the ratio of the height to the width is greater than or equal to 8:1.

* * * * *